United States Patent
Tadeparthy et al.

(10) Patent No.: US 7,679,437 B2
(45) Date of Patent: Mar. 16, 2010

(54) SPLIT-FEEDBACK TECHNIQUE FOR IMPROVING LOAD REGULATION IN AMPLIFIERS

(75) Inventors: Preetam Charan Anand Tadeparthy, Karnataka (IN); Vikram Gakhar, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 42 days.

(21) Appl. No.: 12/043,149

(22) Filed: Mar. 6, 2008

(65) Prior Publication Data

US 2009/0224827 A1 Sep. 10, 2009

(51) Int. Cl.
*H03F 1/36* (2006.01)
(52) U.S. Cl. .................................... 330/105; 330/109
(58) Field of Classification Search ............... 330/102, 330/103, 105, 107, 109

See application file for complete search history.

(56) References Cited

U.S. PATENT DOCUMENTS 4,185,250 A * 1/1980 Regan ...................... 330/107

* cited by examiner

*Primary Examiner*—Steven J Mottola
(74) *Attorney, Agent, or Firm*—William B. Kempler; Wade J. Brady, III; Frederick J. Telecky, Jr.

(57) ABSTRACT

A circuit arrangement and method for improving load regulation in an amplifier (e.g., LDO amplifier) uses a feedback circuit including a parallely connected feedback resistance Rf and a noise reduction feedback capacitance Cf, wherein an external capacitance has equivalent series resistance (ESR). The circuit arrangement includes a resistance Resr in the amplifier output, a junction point of the feedback resistance Rf and the feedback capacitor Cf being connected to a negative input of the LDO amplifier. Additionally, the circuit arrangement might include a resistance Rintentional in between Cf and Rf. The circuit arrangement provides good load regulation and better stability without increase in power/area. The arrangement supports external feedback mode providing design flexibility without compromising amplifier-stability, which provides high output current drive capability or enables driving heavy output capacitance. In a preferred form the invention includes split feedback including AC feedback and DC feedback.

19 Claims, 6 Drawing Sheets

SPLIT-FEEDBACK TECHNIQUE FOR IMPROVING LOAD REGULATION IN AMPLIFIERS

FIELD OF THE INVENTION

This invention generally relates to improving performance in amplifiers, and more particularly to a split-feedback technique in an amplifier for improving load regulation without sacrificing the gain bandwidth product and frequency stability.

BACKGROUND OF THE INVENTION

It is common to use a feedback circuit with amplifiers, from the point of view of performance and design considerations. Amplifiers feed loads that could include an external capacitor, and it is known that these external capacitors generally have equivalent series resistance (ESR) values. The capacitor ESR impacts the performance of the associated circuitry or impacts the associated design considerations.

The ESR of an external capacitor which interacts with an amplifier or regulator might introduce a zero in the loop transfer function. Even though the zero in the loop transfer function might result in improved phase margin, there may be stability-problems because of the wide variation of the ESR. The ESR of external capacitors of the type referred to, especially if they are ceramic capacitors together with other parasitic resistances, might vary from 1 milliohm to 300 milliohms. Such variation of ESR makes compensation very difficult. Typically to reduce the impact of the ESR variation, one can add an intentional internal resistance of about 50 milliohms. Such addition of intentional internal resistance helps to reduce the order of ESR variation by about 50 times (to 50-350 milliohms only), thus making the design easier. The addition of the intentional resistance however causes the load regulation to degrade. Since the added intentional resistance is usually a metallic resistor, it is usually temperature-sensitive and exhibits a +−20% variation owing to process and 4300 ppm with temperature, making the 50 milliohms look like a much larger resistance at higher temperatures and a lower one at lower temperatures. To compensate for the low temperature value, if the nominal value of the resistance is increased, load regulation will have to be sacrificed even more, especially at high temperatures. It is not easy to optimize performance with such constraints for high bandwidth/high current amplifiers.

Proposed herein is a topological design modification which would not hamper stability for capacitor ESR variations and not degrade load regulation in an amplifier.

DESCRIPTION OF THE INVENTION

This invention uses a split feedback technique and a scheme for improving the degradation of load regulation caused by additional metal resistance in an amplifier, e.g., an LDO amplifier, of the type wherein a feedback loop for the amplifier is deployed, wherein the feedback loop might be viewed as including a feedback resistance and a capacitance connected in parallel.

The split feedback technique is independent of the feedback resistor values. A significant added advantage of the present technique is the ability to support external feedback mode where the customer can connect an external feedback resistor and an external feedback capacitor for lowering noise.

The invention in one form resides in a method of improving load regulation and insuring stability in an amplifier of the type wherein a feedback circuit including a parallely connected feedback resistance Rf and a feedback capacitance Cf is deployed, wherein an output from the amplifier feeds an external capacitor having equivalent series resistance (ESR), the method comprising: including an intentionally added impedance Resr in the amplifier output, and connecting the Cf to the amplifier output before the Resr and connecting the Rf to the amplifier output after the Resr, wherein the Cf and Rf are connected to opposite ends of said Resr, a junction point of the feedback resistance Rf and the feedback capacitor Cf being connected to a negative input of the amplifier.

In a second form, the invention resides in a method of improving load regulation and insuring stability in an amplifier of the type wherein a feedback circuit is deployed, wherein an output from the amplifier feeds an external capacitor having equivalent series resistance (ESR), the method comprising: configuring the feedback circuit as a split feedback circuit to include a parallely connected feedback resistance Rf and a feedback capacitance Cf; and, including an intentionally added impedance Resr in the amplifier output, and connecting the Cf to the amplifier output before the Resr and connecting the Rf to the amplifier output after the Resr, wherein the Cf and Rf are connected to opposite ends of the Resr, a junction point of the feedback resistance Rf and the feedback capacitor Cf being connected to a negative input of the amplifier.

In a third form, the invention resides in a scheme for improving load regulation in an LDO amplifier without sacrificing amplifier-stability, comprising: a split feedback circuit including a parallely connected DC feedback resistance Rf and a noise reduction AC feedback capacitance Cf, wherein an output from the amplifier feeds an external capacitor having equivalent series resistance (ESR), the scheme comprising: including an intentionally added resistance Resr in the amplifier output, and connecting the Cf to the amplifier output before the Resr and connecting the Rf to the amplifier output after the Resr, wherein the Cf and Rf are connected to opposite ends of the Resr, a junction point of said feedback resistance Rf and said feedback capacitor Cf being connected to a negative input of the amplifier.

The invention in another form resides in a circuit arrangement for improving load regulation in an LDO amplifier without sacrificing amplifier-stability, comprising a feedback circuit including a parallely connected feedback resistance Rf and a noise reduction feedback capacitance Cf, wherein the amplifier output feeds an external capacitance exhibiting equivalent series resistance (ESR), the circuit arrangement comprising: a resistance Resr in the amplifier output, wherein the Cf is connected to the amplifier output before the Resr and the Rf is connected to the amplifier output after the Resr whereby said Cf and Rf are connected to opposite ends of said Resr, a junction point of the feedback resistance Rf and the feedback capacitor Cf being connected to a negative input of the amplifier; the circuit arrangement including an additional resistance (intentional resistance-Rintentional) connected in series with the resistance Rf, and, a further resistance connected between a junction of Rf and Rintentional, and connected to ground.

BRIEF DESCRIPTION OF THE DRAWING

A more detailed understanding of the invention may be had from the following description of preferred embodiments, given by way of example and to be understood in conjunction with the accompanying drawing wherein.

DETAILED DESCRIPTION

Figure 1:
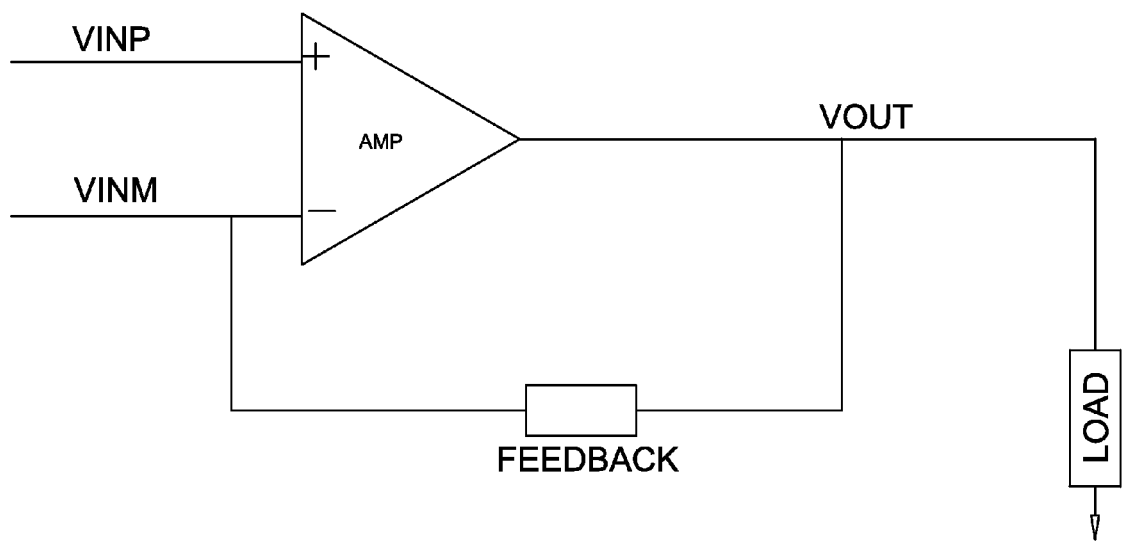
FIG. 1 is an illustration of a generic amplifier with feedback.

A detailed description of one or more embodiments of the invention is provided below in the context of the accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention.

The present invention may be practiced according to the claims without some or all of these specific details. For the purpose of clarity, technical material that is known in the technical fields related to the invention has not been described in detail so that the present invention is not unnecessarily obscured.

Any linear time-invariant system can be represented as $$V_{out} = H(s) * V_{in}$$

where H(s) is the transfer function from input to the output and where "s" is a complex parameter which is frequency dependent. Hence in some cases the transfer function of an amplifier can be written in the following way:

$$H(s) = A0*(1+s/\omega_{Z1})*(1+s/\omega_{Z2})* \ldots (1+s/\omega_{Zn})/\{(1+s/\omega_{P1})*(1+s/\omega_{P2})* \ldots (1+s/\omega_{Pn})\}$$

where "$\omega_{Z1}, \omega_{Z2} \ldots \omega_{Zn}$" are the Zeros of the transfer function as they are part of the numerator of the transfer functions and are dependent on the circuit implementation, and similarly where "$\omega_{p1}, \omega_{p2} \ldots \omega_{pn}$" are the poles of the transfer function as they are part of the denominator of the transfer function.

As "s" is a complex parameter that is frequency dependent, "s" can be replaced with a more relevant parameter, i.e., $s = i*\omega$, where "$\omega$" is a continuous variable in Radians/sec. It can also be written as $\lambda = 2*\pi*f$ where f is the frequency.

Hence each of the terms in the above equation can be modified as shown below:

$$H(i*\omega) = A0*(1+i*\omega/\omega_{Z1})*(1+i*\omega/\omega_{Z2})* \ldots (1+i*\omega/\omega_{Zn})/\{(1+i*\omega/\omega_{P1})*(1+i*\omega/\omega_{P2})* \ldots (1+i*\omega/\omega_{Pn})\}$$

From the equation, it is seen that the numerator terms add to positive phase as frequency ("$\omega$") approaches each of the "$\omega_Z$" and the denominators add negative phase to the transfer function as frequency ("$\omega$") approaches each "$\omega_P$". For any system in feedback to be stable, it is important that the overall phase loss (negative phase) when the gain is greater than 1 be <360. Hence if in a system there are a lot of poles. It becomes important to introduce Zeros in the loop transfer function so that additional loss in the phase is somewhat compensated by the phase gain due to the Zeros. For instance, if there is a capacitor (C) and a resistor (R) in series, the overall impedance has 1 zero and 1 pole give by $Z = (1+i*\omega*R*C)/i*\omega*C$. The Zero is located at $\omega_Z = 1/RC$ In the case presented above, where there is an external capacitance with its ESR, the overall impedance seen by the amplifier is given by the same equation as written above with 1 Zero and 1 pole (at origin). This Zero improves phase loss and improves stability in the amplifier.

It is noted that if this Zero changes due to variation in the ESR value, it will not be able to compensate the phase loss at the frequency where it is needed. For instance from the above $H(i*\omega)$, it is clear than there is no phase loss or gain at lower frequencies till, "$\omega$" is closer to one of the pole or Zero frequencies. Hence herein is presented a case where a critical frequency is introduced, only after which the Zero plays a role, thereby enabling the designer to use all the good properties of the amplifier upto this frequency and beyond which, where the performance has degraded, (there is a lot of phase loss due to poles and the gain rolls off too,) to have another feedback path with the Zero in place to improve stability and enhance the usability range of the amplifier (where the phase loss is not very significant).

Considered below in general is any feedback amplifier with a feedback (which might be scalar or vector) to ensure that the output is the same as the input applied in the positive terminal with only scaling. Here the amplifier is used as a gain stage to track the input signal given at the positive terminal. Such amplifiers are used in varied applications that would need high output current drive capability or would need to drive heavy output capacitor as described herein. These capacitors as described have a huge ESR variation adversely affecting the stability.

An amplifier used in feedback (with just a scalar feedback for example) is shown in FIG. 1. More particularly, FIG. 1 illustrates an amplifier (Amp) and a feedback network which ensures that the value at the output is proportionally given to the negative terminal of the amplifier. Such conventional design could be used to drive capacitive loads. In the illustration of FIG. 1 as well as FIG. 2, the block 'Feedback', could comprise both a DC feedback and an AC feedback except that the feedbacks are not being used separately. A typical case of LDO is explained subsequently where AC feedback (Cf) and DC feedback (Rf) are always present except that they are not seen separately but used separately and exploited as needed.

Figure 2:
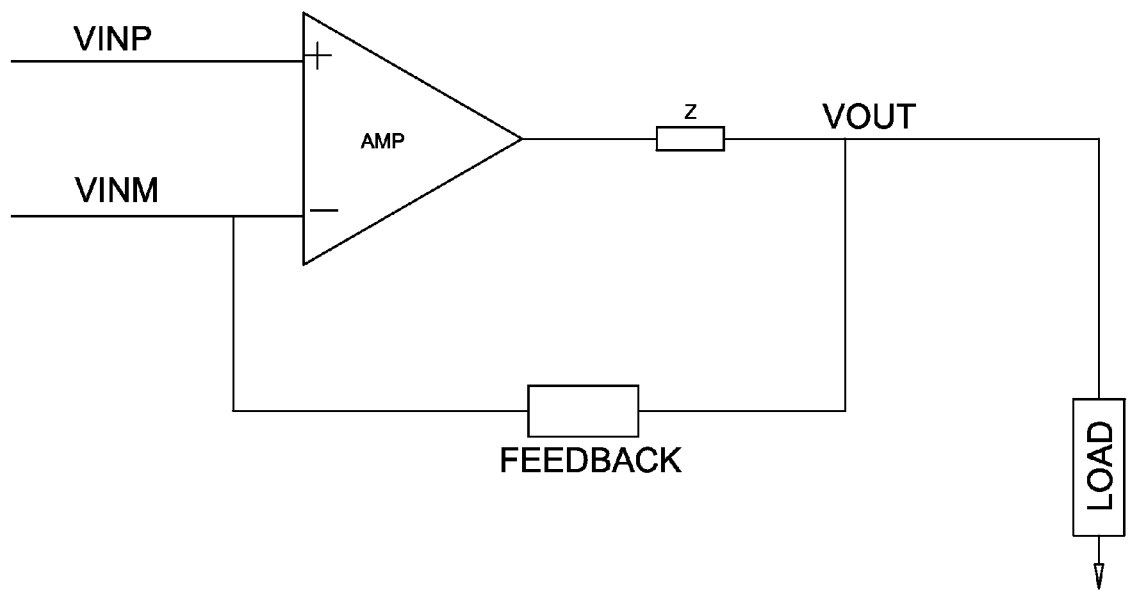
FIG. 2 shows an element Z added in series with V-OUT to FIG. 1.

FIG. 2 illustrates a modified FIG. 1 scenario including a series impedance component "Z" added as shown that is intentionally added to the output of the amplifier, but before the feedback point.

Under open loop conditions, this component 'Z' isolates the output capacitance and actually adds to the capacitance ESR (which can vary from 0-300 m$\Omega$). This makes the effective ESR (under open loop only)=$Z+C_{ESR}$. Even though it looks like the effective ESR has been modified because of 'Z', this effectiveness is lost when the complete feedback is taken after 'Z' (FIG. 2). Taking the feedback before 'Z' and leaving 'Z' outside the loop is one option, but has a consequential problem in that this component 'Z' could interfere with the output regulation or the output accuracy specification and hence is undesirable. To circumvent this problem, a simple topological modification can be introduced as explained hereinafter.

Typically at DC the amplifier does not need an intentional "Zero" from the ESR of the external capacitor. If the external capacitor is changing from say 100 nF to 10 uF and the ESR is changing from 0-300 m$\Omega$, the "Zero" because of this ESR will change from 53 kHz to infinity. Introducing an impedance element 'Z' as shown in FIG. 2 only modifies the lower cutoff by a small value (CESR is already very high at 300 m$\Omega$), while the upper cutoff which was infinity will significantly move into lower frequency depending on the component type and value.

Figure 3:
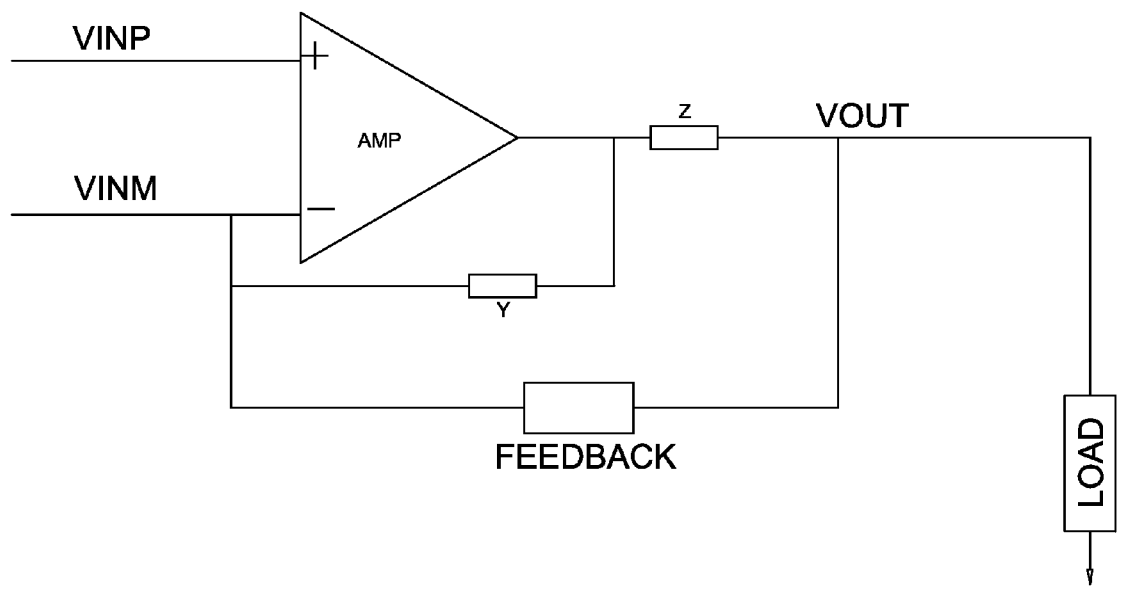
FIG. 3 shows the amplifier of FIG. 2 with an added split feedback element Y.

Hence it is possible to leverage the benefit of the fact that the "Zero" itself does not play any role till a frequency is seen. Notably, in FIG. 2, another simple component 'Y' (which can be called the AC feedback) is introduced, see FIG. 3, with the result that, the impedance of 'Y' is lower than the impedance due to the DC feedback alone beyond certain frequencies after which the Zero could possibly occur (In the above example the certain frequencies may be<53 KHz). This new component 'Y'' could be part of an already existing feedback network itself and hence it is only a question of identifying the AC component of the feedback network and the DC component and splitting them as shown in FIG. 3. If the existing feedback is purely a scalar feedback then this additional component 'Y' should be added to introduce the AC feedback component.

The foregoing technique will guarantee that the component 'Z' is outside the loop beyond a certain critical frequency (as feedback since the AC component dominates feedback due to DC component) and hence will add to the value of ESR in series, reducing the variation in the FIG. 3 arrangement. And below this "critical frequency", it is the DC feedback that would overrule the feedback due to 'Y' and hence any adverse DC effect due to the introduction of this (Z) component is reduced significantly by the DC gain in the loop. This technique should work with any amplifier that is designed to drive external loads and external capacitors.

Exemplary conditions on the critical frequency after which the AC feedback takes over the DC feedback:
It is noted that $R_{ESR}max = Z_{MAX} + ESR_{Cext}$.
If the minimum frequency at which the zero due to external capacitance and ESR is governed by $$F_{min} = 1/(2*pi*R_{ESR}max*C_{LOAD}Max)$$

For Frequencies>$F_{min}$ i.e., for any F>$F_{min}$
Impedance due to AC feedback<Impedance due to DC feedback i.e.,
Impedance of Y, Y(F)<Impedance due to DC feedback. It is noted that if this condition for critical frequency is met then all the advantages of adding the impedance component 'Z' are met.

Figure 4:
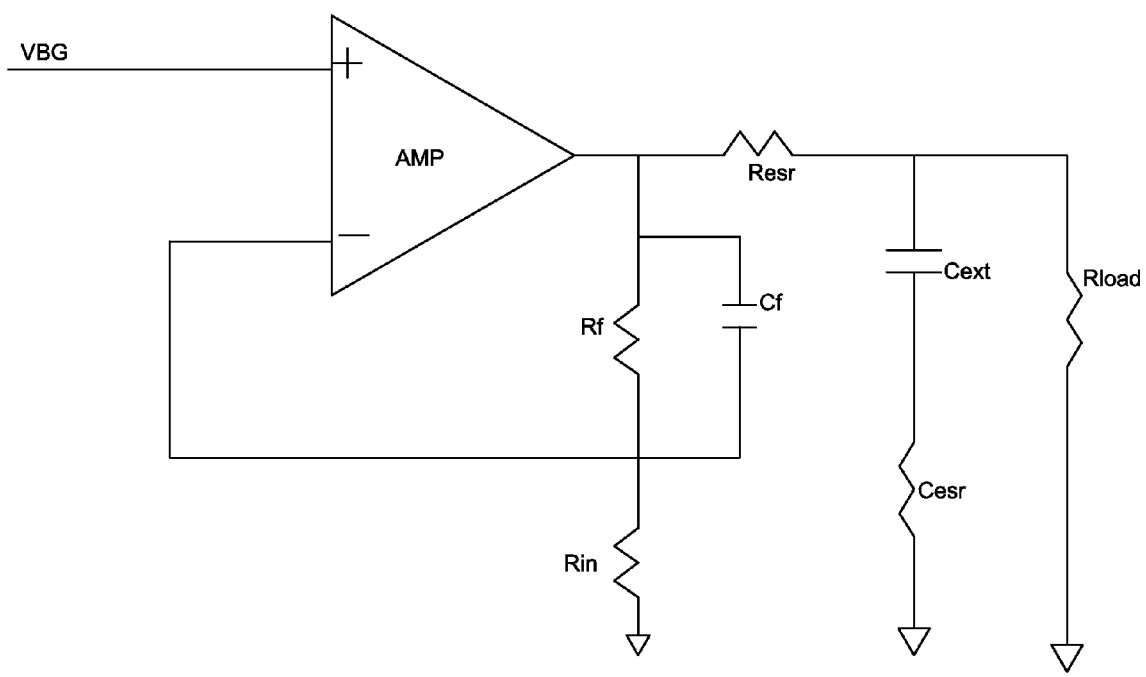
FIG. 4 illustrates a typical LDO amplifier in the context of the invention.

A typical prior art LDO amplifier is shown in FIG. 4, with feedback resistance (which is typically programmable) and a noise reduction feedback capacitor. It is well known that at frequencies greater than Rf*Cf, the impedance of the capacitor is lower than that of the resistor and the feedback is provided by the capacitor. In other words, there is a DC feedback which is provided by the resistors and an AC feedback provided by the capacitors. Obviously around Rf*Cf both the resistors and capacitors would be involved in feedback.

Typically for Low Iq parts, Rf is generally chosen to be at least 100 kΩ and for noise reasons have ~25 pF capacitor shunting Rf. So at frequencies>100 KHz the feedback is provided by the capacitor.

The ESR zero with 1 uF capacitor with 300 mΩ ESR is typically at 500 kHz at best.

Figure 5:
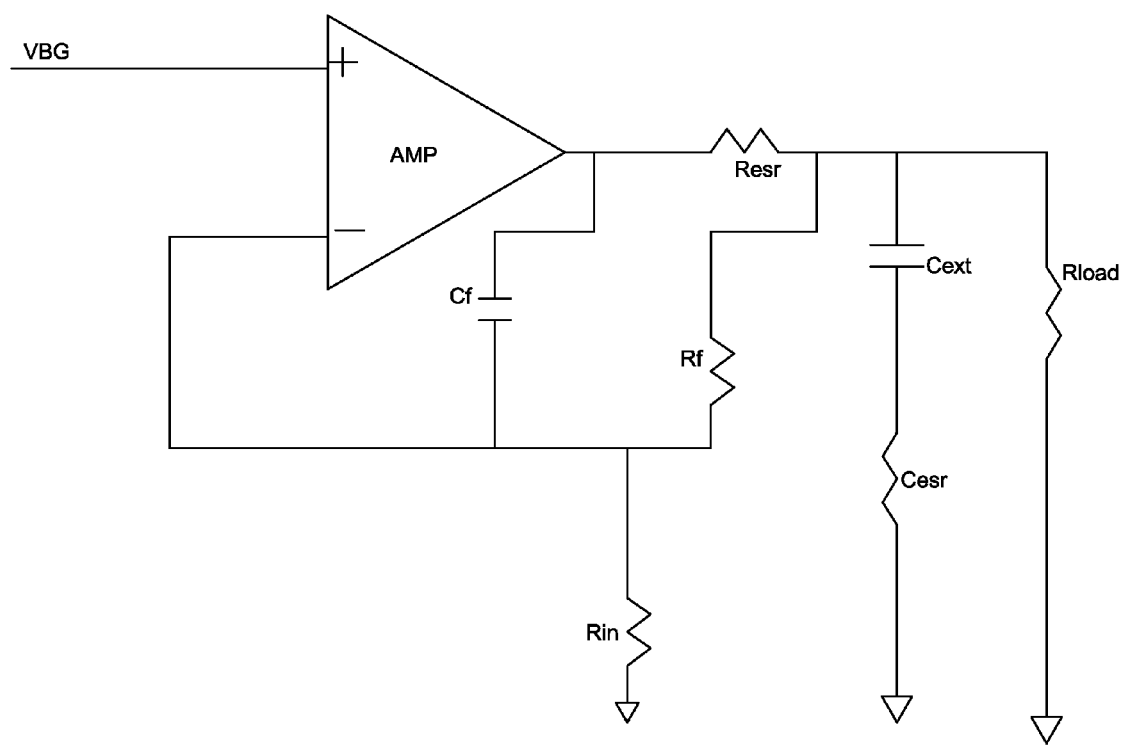
FIG. 5 shows a topological modification of FIG. 4 to improve load regulation; and, FIG. 6 shows the FIG. 5 illustration with an added intentional resistor Rint.

FIG. 5 illustrates an embodiment of the invention, showing an exemplary topological modification which would enable independent choice of the internal ESR, improving load regulation without affecting stability.

From FIG. 5 it is to be noted that the DC feedback is taken from the pad (or double bond and from PIN ) which would include all the possible intentional internal resistance inside the loop making the design look like an ideal voltage source for all currents, which reduces the output impedance and thus improves the load regulation. But for higher frequencies because the feedback is from the capacitor and not from the resistor, the ESR is now part of the loop transfer function. This would mean that the zero associated with the ESR will aid the loop transfer function in a constructive way. Simple mathematical equations can show that the ESR indeed does not get modified. And if there is a case where the feedback is not completely capacitive, the effective ESR seen will drop by the ratio of impedance of the feedback capacitor and feedback resistor. Thus it is possible to decouple stability with load regulation.

Though this basic form of topological modification is good enough to take care of ESR variation, the resulting device is limited by the value of Rf. Typically, LDOs have a huge programmable voltage range and/or have a mode where the customer is having feedback resistors externally. In both the cases the value of Rf is typically not under control, whereby it is difficult to ensure and guarantee that the impedance of Cf is lower than Rf over such ranges. To add to the complexity in external feedback modes, if the customer adds a feedback capacitor across external Rf for lower noise reasons, there is a possibility that the concept might not work as desired, resulting in a unity gain configuration independent of internal capacitive feedback tap point or value.

Figure 6:
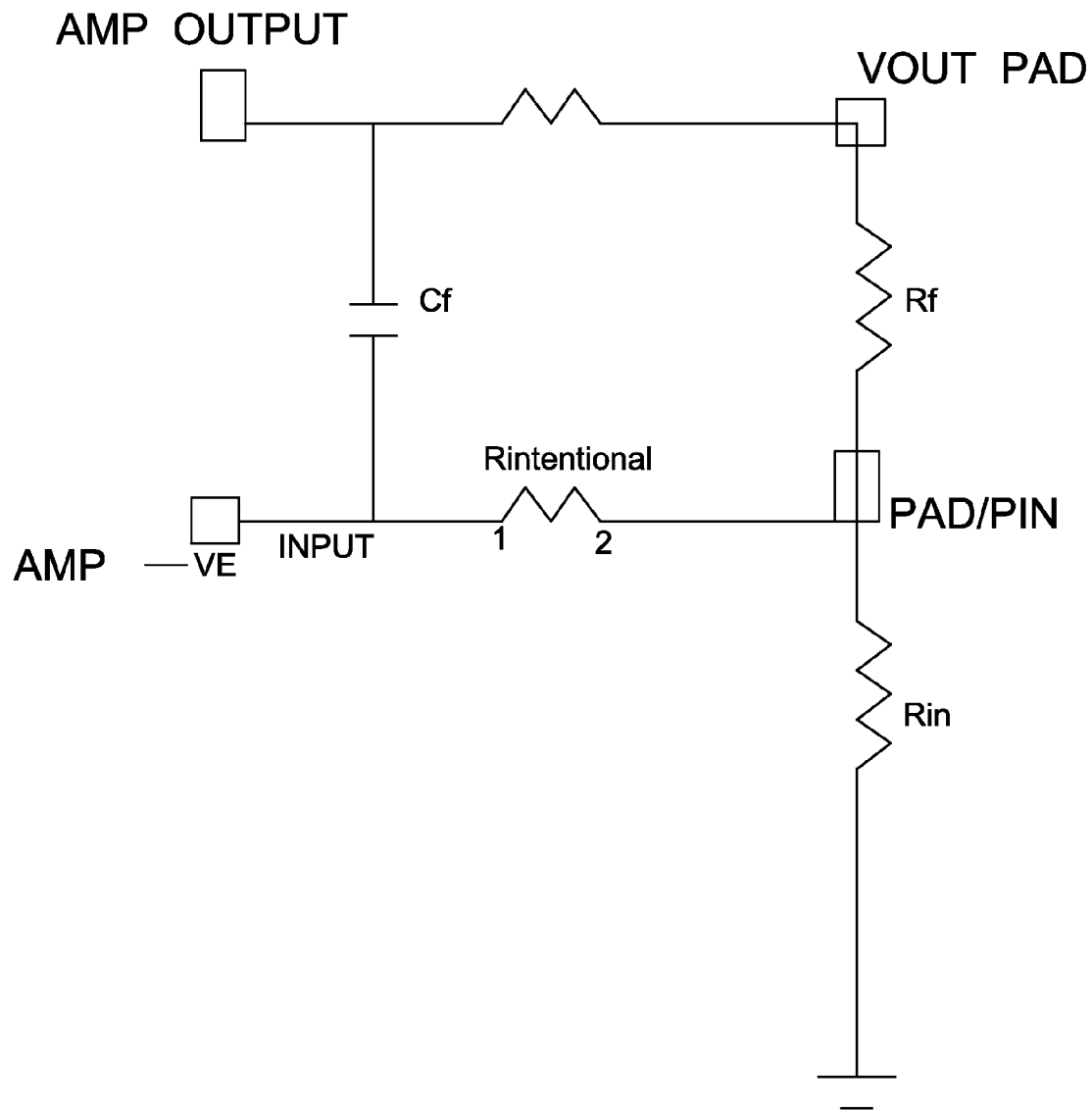

A further circuit modification as shown in FIG. 6 is intended to solve certain issues which might be present in the arrangement of FIG. 5. Adding an intentional resistor between the resistive feedback and the capacitive feedback, gives additional freedom to modify Rf to any desired value. Preferably however, for the technique to work well, the impedance of Cf should be comparable to (Rintentional+Rf) because Rintentional can be independently chosen regardless of the value of Rf, which is governed by programming. Thus, the efficacy of the function of the technique can be enhanced.

A simple extension of the above technique is to use an external feedback resistive network. In the external feedback, the LDO is configured to give out the negative feedback terminal to the external world and the customer is expected to connect Rf and Rin to get the desired output value. Now to ensure stability and guarantee the above technique to function properly, it is only needed to give out terminal '2' side of Rintentional or PAD/PIN point in the design. This will ensure that the capacitive feedback is still present at high frequency guaranteeing all the advantages of the technique. The presence of Rintentional ensures independent choice of Rf and Rin to derive the desired output voltage.

Typically in an external feedback mode with Pad/Pin node (FIG. 6) coming out, the customer would connect Rf and Rin for what ever desired output voltage, and also connect an external large capacitor Cfext across Rf to reduce noise. It is noted that if Rintentional were absent, it would result in a unity gain amplifier, and the internal capacitor would be relatively less useful. But with Rintentional in the loop, even if Cfext is a dysfunctional at very low frequency, Rintentional shields it from Amp-ve input thus ensuring performance at high frequency (governed by Rintentional and Cf, internal capacitive is what determines high frequency loop gain), in which case again all the advantages because of this inventive technique follow.

By using the above inventive technique, load regulation is significantly improved with no compromise on stability. The present design and approach as illustrated and described hereinabove provides better stability in addition to good load regulation with no increase in power/area. The technique is independent of the feedback resistors values. A significant added advantage is the ability of the present approach to support external feedback mode where the customer can connect an external feedback resistor and an external feedback capacitor for noise.

In the foregoing detailed description of embodiments of the invention, various features are grouped together in a single exemplary embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of embodiments of the invention, with each claim standing on its own as a separate embodiment. It is understood that the above description is intended to be illustrative, and not restrictive. It is intended to cover alternatives, modifications and equivalents as may be included within the spirit and scope of the invention as defined in the appended claims. Many other embodiments will be apparent to those of skill in the art upon reviewing the above description. The scope of the invention should therefore be determined with reference to the appended claims, along with the full scope of equivalents to which such claims are entitled. In the appended claims, the terms "including" and "in which" where present, are used as the plain-English equivalents of the respective terms "comprising" and "wherein," respectively. Moreover, the terms "first," "second," and "third," etc., where present are used merely as labels, and are not intended to impose numerical requirements on their objects.

The invention claimed is:

1. A method of improving load regulation and insuring stability in an amplifier of the type wherein a feedback circuit including a parallely connected feedback resistance Rf and a feedback capacitance Cf is deployed, wherein an output from the amplifier feeds an external capacitor having equivalent series resistance (ESR), the method comprising:
   including an intentionally added impedance Resr in the amplifier output, and connecting said Cf to the amplifier output before the Resr and connecting the Rf to the amplifier output after the Resr, whereby said Cf and Rf are connected to opposite ends of said Resr, a junction point of said feedback resistance Rf and said feedback capacitor Cf being connected to a negative input of the amplifier; and
   including an external capacitor Cext connected across Rf to reduce noise.

2. The method as in claim 1 wherein the amplifier comprises a LDO amplifier, the method including the step of providing an additional resistance (intentional resistance-Rintentional) in series with said resistance Rf.

3. The method as in claim 2 including the step of providing a further resistance between a junction of Rf and Rintentional, and connecting it to ground.

4. The method as in claim 1 wherein said Cf causes an AC feedback impedance and said Rf causes a DC feedback impedance, and said Cf and Rf are so configured that for frequencies $> F_{min}$, the AC feedback impedance < the DC feedback impedance, where, $F_{min}=1/(2*pi*R_{ESR}max * C_{LOAD}MaX)$, where $R_{ESR}maX$ is a maximum value of Resr and $C_{LOAD}Max$ is a maximum value of the load capacitance.

5. The method as in claim 1 wherein Rf and Cf are chosen as desired.

6. The method as in claim 1 wherein said resistance Rf is programmable.

7. The method as in claim 1 including an external feedback capacitance and an external feedback resistance.

8. The method as in claim 1 wherein the ESR of the external capacitor is part of a loop transfer function.

9. A method of improving load regulation and insuring stability in an amplifier of the type wherein a feedback circuit is deployed, wherein an output from the amplifier feeds an external capacitor having equivalent series resistance (ESR), the method comprising:
   configuring said feedback circuit as a split feedback circuit to include a parallely connected feedback resistance Rf and a feedback capacitance Cf; and
   including an intentionally added impedance Resr in the amplifier output, and connecting said Cf to the amplifier output before the Resr and connecting the Rf to the amplifier output after the Resr, whereby said Cf and Rf are connected to opposite ends of said Resr, a junction point of said feedback resistance Rf and said feedback capacitor Cf being connected to a negative input of the amplifier, wherein the amplifier comprises a LDO amplifier, the method including the step of providing an additional resistance (intentional resistance-Rintentional) in series with said resistance Rf.

10. A scheme for improving load regulation in an LDO amplifier without sacrificing amplifier-stability, comprising:
   a split feedback circuit including a parallely connected DC feedback resistance Rf and a noise reduction AC feedback capacitance Cf, wherein an output from the amplifier feeds an external capacitor having equivalent series resistance (ESR), the scheme comprising:
   including an intentionally added resistance Resr in the amplifier output, and connecting said Cf to the amplifier output before the Resr and connecting the Rf to the amplifier output after the Resr, wherein said Cf and Rf are connected to opposite ends of said Resr, a junction point of said feedback resistance Rf and said feedback capacitor Cf being connected to a negative input of the amplifier and including an additional resistance (intentional resistance-Rintentional) connected in series with said resistance Rf.

11. The scheme as in claim 10 including the step of providing a further resistance between a junction of Rf and Rintentional, and connecting it to ground.

12. The scheme as in claim 10 wherein said Cf causes an AC feedback impedance and said Rf causes a DC feedback impedance, and said Cf and Rf are so configured that for frequencies $> F_{min}$, the AC feedback impedance<the DC feedback impedance, where, $F_{min}=1/(2*pi*R_{ESR}max*C_{LOAD}Max)$, where $R_{ESR}max$ is a maximum value of Resr and $C_{LOAD}Max$ is a maximum value of the load capacitance.

13. The scheme as in claim 10 wherein Rf is at least 100 kΩ, and Cf is approximately 25 pf.

14. The scheme as in claim 10 including an external capacitor Cext connected across said resistance Rf to reduce noise.

15. The scheme as in claim 10 wherein said resistance Rf is programmable.

16. The scheme as in claim 10 wherein said capacitance Cf is configured as an internal feedback capacitance, and said resistance Rf is configured as an external feedback resistance, including an external capacitance Cext across said Rf for noise reduction.

17. The scheme as in claim 10 wherein the ESR of the external capacitor is part of a loop transfer function.

18. The scheme as in claim 10 wherein said Cf and Rf in association with said Resr are so configured that Cf has lower impedance than Rf in an external feedback mode.

19. A circuit arrangement for improving load regulation in an LDO amplifier without sacrificing amplifier-stability, comprising:

a feedback circuit including a parallely connected feedback resistance Rf and a noise reduction feedback capacitance Cf, wherein the amplifier output feeds an external capacitance exhibiting equivalent series resistance (ESR), the circuit arrangement comprising:

a resistance Resr in the amplifier output, wherein said Cf is connected to the amplifier output before the Resr and the Rf is connected to the amplifier output after the Resr, whereby said Cf and Rf are connected to opposite ends of said Resr, a junction point of said feedback resistance Rf and said feedback capacitor Cf being connected to a negative input of the amplifier;

said circuit arrangement including an additional resistance (intentional resistance-Rintentional) connected in series with said resistance Rf, and a further resistance connected between a junction of Rf and Rintentional, and connected to ground.

* * * * *